US012795822B2

(12) United States Patent
Wellens et al.

(10) Patent No.: US 12,795,822 B2
(45) Date of Patent: Nov. 10, 2026

(54) ELECTRONIC ASSEMBLY WITH THERMALLY OPTIMIZED PRINTED CIRCUIT BOARD

(71) Applicant: VALEO COMFORT AND DRIVING ASSISTANCE, Créteil (FR)

(72) Inventors: Matthias Wellens, Créteil (FR); Simon Pfaff, Créteil (FR); Hubert Gleich, Créteil (FR); Dirk Wischnewski, Créteil (FR)

(73) Assignee: VALEO COMFORT AND DRIVING ASSISTANCE, Créteil (FR)

( * ) Notice: Subject to any disclaimer, the term of this patent is extended or adjusted under 35 U.S.C. 154(b) by 241 days.

(21) Appl. No.: 18/718,436

(22) PCT Filed: Jan. 24, 2022

(86) PCT No.: PCT/EP2022/051509
§ 371 (c)(1),
(2) Date: Jun. 11, 2024

(87) PCT Pub. No.: WO2023/110155
PCT Pub. Date: Jun. 22, 2023

(65) Prior Publication Data

US 2025/0056717 A1 Feb. 13, 2025

(30) Foreign Application Priority Data

Dec. 15, 2021 (EP) .................................... 21214667

(51) Int. Cl.
*H05K 1/02* (2006.01)

(52) U.S. Cl.
CPC ......... *H05K 1/0298* (2013.01); *H05K 1/0203* (2013.01)

(58) Field of Classification Search
CPC .. H05K 1/0206; H05K 1/0298; H05K 1/0203; H05K 1/05; H05K 2201/066; H05K 2201/093; H05K 2201/10303
(Continued)

(56) References Cited

U.S. PATENT DOCUMENTS 7,442,050 B1 * 10/2008 Bhakta ................... H05K 1/147 439/71
2016/0174382 A1 * 6/2016 Kraft .................... H05K 1/0203 361/688

(Continued)

FOREIGN PATENT DOCUMENTS

WO 2013/192053 A1 12/2013

OTHER PUBLICATIONS

International Search Report issued in corresponding International Application No. PCT/EP2022/051509 mailed Sep. 13, 2022 (3 pages).

(Continued)

*Primary Examiner* — Timothy J Thompson
*Assistant Examiner* — Michael F Mcallister
(74) *Attorney, Agent, or Firm* — Osha Bergman Watanabe & Burton LLP

(57) ABSTRACT

An electronic assembly is disclosed. The electronic assembly includes a printed circuit board including an alternating arrangement of electrically conducting layers and electrically insulated layers, and at least one electronic module fixed on a first side of the printed circuit board. The electronic module includes multiple pins so as to electrically couple the electronic module and the printed circuit board. The electronic assembly also includes at least one cooling module placed on a second side of the printed circuit board. Each electrically conductive layer of the printed circuit board includes a non-electrically conductive area extending
(Continued)

along at least a part of a closed outline positioned around a central axis going through a center of the cooling module and a center of the electronic module.

14 Claims, 5 Drawing Sheets

(58) Field of Classification Search
USPC .......................................................... 174/251
See application file for complete search history.

(56) References Cited

U.S. PATENT DOCUMENTS

| | | | |
|---|---|---|---|
| 2016/0278200 | A1 | 9/2016 | Costes |
| 2017/0280552 | A1 | 9/2017 | Wiesa |

OTHER PUBLICATIONS

Written Opinion issued in corresponding International Application No. PCT/EP2022/051509 mailed Sep. 13, 2022 (6 pages).

* cited by examiner

ELECTRONIC ASSEMBLY WITH THERMALLY OPTIMIZED PRINTED CIRCUIT BOARD

TECHNICAL FIELD

The invention belongs to the technical field of electronic devices.

It relates specially to electronic devices used in automotive vehicles, for instance telecommunication devices used for telematics operations in cars, and also relates to means for cooling electronic devices.

More precisely the invention relates to an electronic assembly comprising:

- a printed circuit board comprising an alternating of electrically conductive layers and electrically insulated layers,
- at least one electronic module fixed on a first side of the printed circuit board, said electronic module comprising a plurality of pins so as to electrically couple said electronic module and the printed circuit board, and
- at least one cooling module, placed on a second side of the printed circuit board.

Technological Background

Telematics control units are embedded electronic systems that perform telecommunication operations, for instance operations for establishing wireless connections between a vehicle and external services (such as services provided by a vehicle manufacturer) or operations of tracking of the vehicle. In order to optimize the telecommunication performance and to associate the antennas with electronic components, telematics control units are often placed on the roof of the vehicle.

The temperature of the roof of a vehicle is subject to large variation. For instance, the temperature of the roof of a black car exposed to solar radiation during a sufficiently long period of time may reach more than 100° C. The optimal temperature for a good functioning of the telematics control unit is often below this limit. Such temperature rises may hinder the proper functioning of the telematics control unit and thus reduce the availability of the communication services.

Several solutions exist to cool down the telematics control units. In particular, document US2017/0170542 describes the use of a cooler based on a Peltier element in order to cool down the telematics control unit. However, such electronic systems present drawbacks that limit the efficiency of the cooling.

SUMMARY OF THE INVENTION

The invention relates to an electronic assembly that allows improving the efficiency of the cooling.

More particularly, the invention relates to an electronic assembly as defined in the introduction and in which each electrically conductive layer of the printed circuit board comprising a non-electrically conductive area extending along at least a part of a closed outline positioned around a central axis going through a centre of the cooling module and a centre of the electronic module.

This non-electrically conductive area is free from electrically conductive material. Thanks to the invention, the presence of non-electrically conductive areas in the electrically conductive layers thus allows reducing significantly the thermal conductivity of the printed circuit board and thus improving the global cooling of the electronic module.

Other advantageous features of the electronic assembly are the following ones:

- the closed outline is comprised in or placed in contact with a side surface of a volume, an end of which is formed by the contact surface between the electronic module and the printed circuit board, another end of said volume being formed by a contact surface of the cooling module and the printed circuit board;
- the non-electrically conductive area in each electrically conductive layer presents a form of a dashed outline;
- an external electrically conductive layer is defined as the electrically conductive layer of the printed circuit board closest to the electronic module;
- the dashed outline of said external electrically conductive layer is a dashed rectangle going along the edges of said electronic module;
- an internal electrically conductive layer is defined as the electrically conductive layer of the printed circuit board closest to the cooling module;
- the dashed outline of said internal electrically conductive layer is a dashed rectangle going along the edges of said cooling module;
- all the non-electrically conductive areas of the electrically conductive layers are aligned with each other through the printed circuit board;
- the non-electrically conductive area in each electrically conductive layer presents a form of a continuous outline;
- the ground pins of the electronic module being located in a central area of the electronic module, an external electrically conductive layer being defined as the electrically conductive layer of the printed circuit board closest to the electronic module, the continuous outline of said external electrically conductive layer is a continuous rectangle going along the edges of the central area of the electronic module;
- an internal electrically conductive layer being defined as the electrically conductive layer of the printed circuit board closest to the cooling module, the continuous outline of said internal electrically conductive layer is a continuous rectangle going along the edges of said cooling module;
- each continuous outline being a continuous rectangle, the continuous rectangles in each electrically conductive layer are comprised between the continuous rectangle of the external electrically conductive layer and the continuous rectangle of the internal electrically conductive layer;
- the respective continuous rectangles associated with two consecutive electrically conductive layers are positioned such as not overlapping with each other through the printed circuit board;
- the electronic assembly further comprises a plurality of through-hole vias extending through the printed circuit board, said through-hole vias being arranged to thermally couple said electronic module to said cooling module;
- the non-electrically conductive area comprises a material with fibers and a polymer; and
- the electronic assembly further comprises:
- a) a casing having a thermally conductive wall, and
- b) fastening means configured to keep the printed circuit board at a distance from the thermally conductive wall inside the casing,
- c) the cooling module comprising at least one active part.

The different characteristics, variants, and embodiments of the invention may be combined with each other in various combinations insofar as they are not incompatible or exclusive of each other.

DESCRIPTION OF THE DRAWINGS

Many other features of the invention are apparent from the following description made with reference to the drawings which illustrate embodiments of the invention, in no way limiting, and where.

It should be noted that in these figures, the structural and/or functional elements common to the different embodiments may have the same references even if they have slightly different features.

DESCRIPTION OF EMBODIMENTS

It should be noted that, in this description, the sign ";" is used to separate the references of different embodiments.

Figure 1:
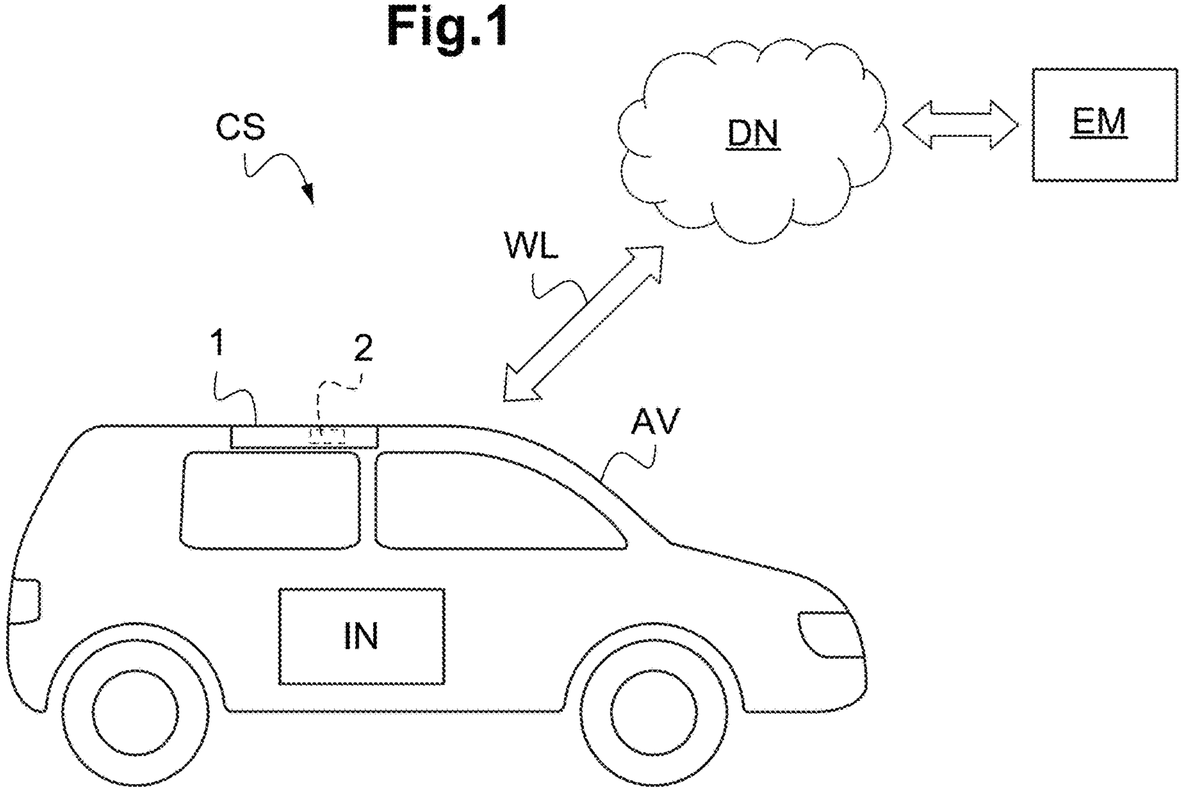
FIG. 1 represents a telecommunication system in which an electronic system according to the invention is embedded in an automotive vehicle.

FIG. 1 represents a communication system CS comprising an automotive vehicle AV, a distant network DN and an equipment manufacturer backend system EM. The automotive vehicle is able to establish a wireless communication link WL with the distant network DN. The equipment manufacturer backend system EM is linked to the distant network DN so that a communication channel may be established between the automotive vehicle AV and the equipment manufacturer backend system EM.

As represented in FIG. 1, the automotive vehicle AV (for example here, a car) comprises an electronic assembly 1 according to the invention. This electronic assembly is here located on the roof of the automotive vehicle AV.

Figure 2:
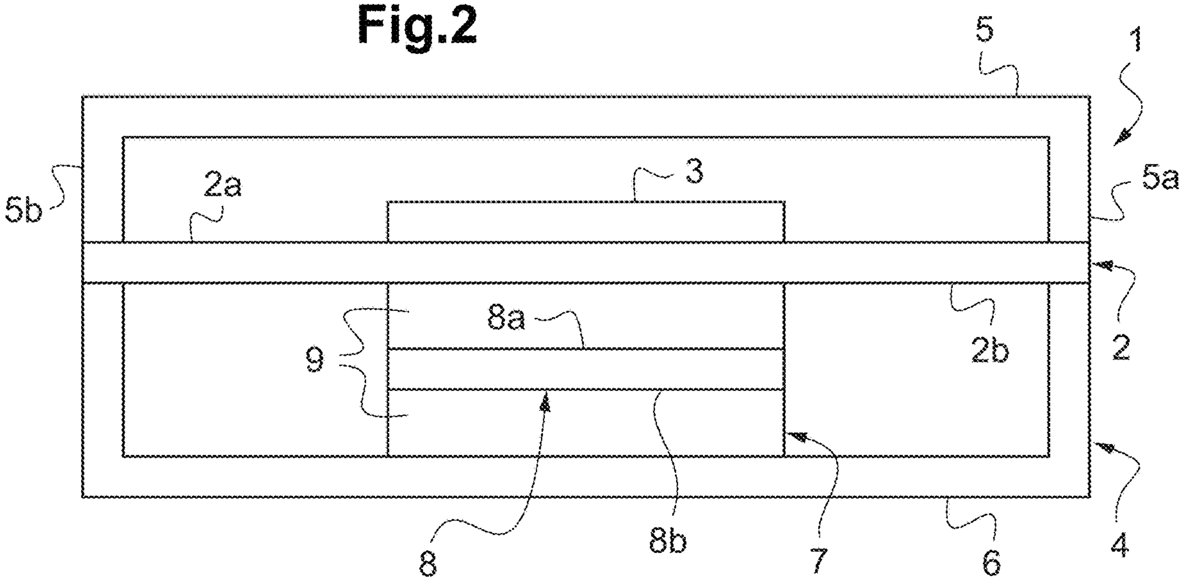
FIG. 2 represents a first example of an electronic assembly according to the invention, represented in cross-section from the side.
Figure 3:
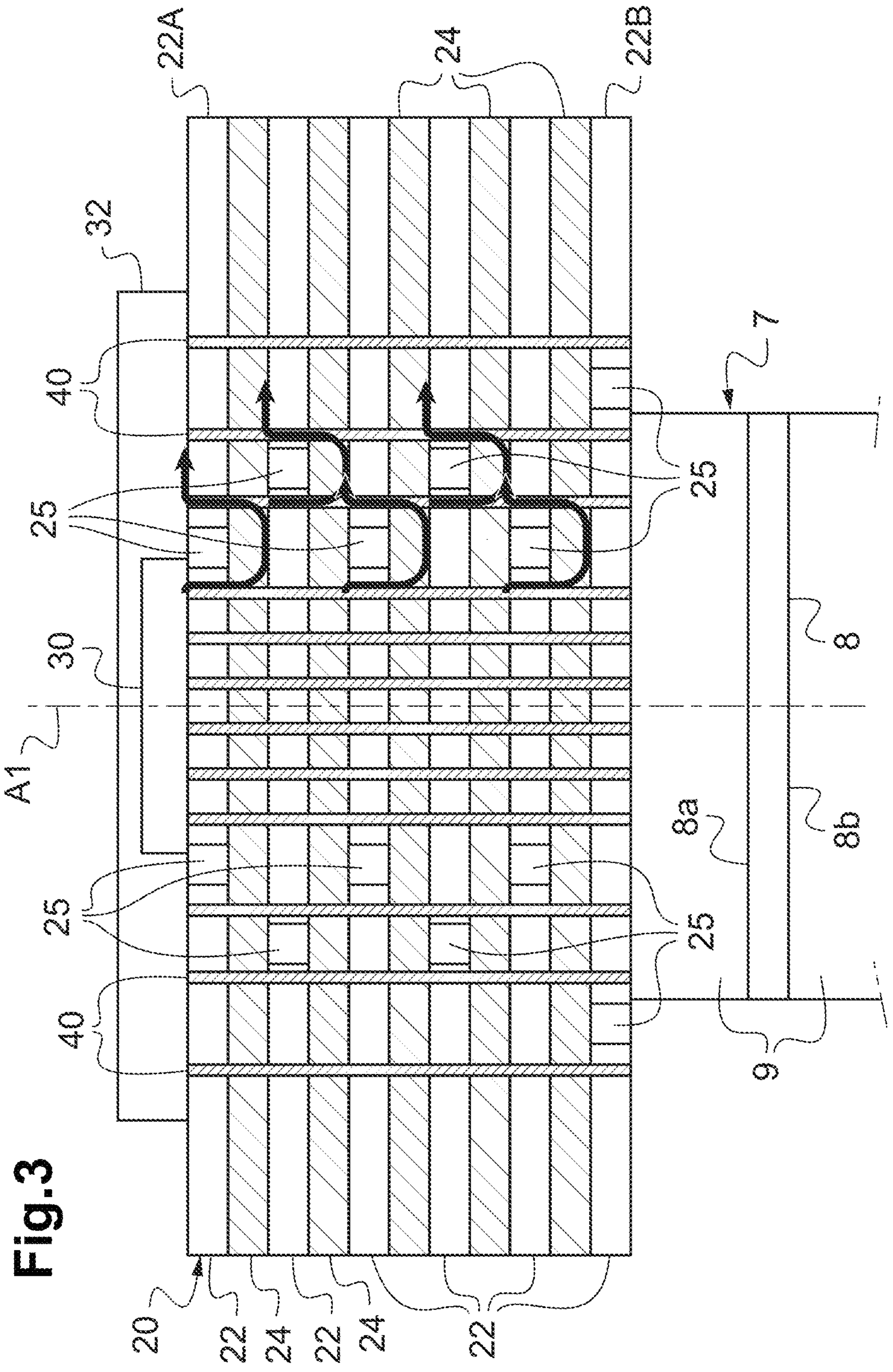
FIG. 3 shows a first example of a printed circuit board comprised in the electronic assembly according to the invention, represented in cross-section from the side.
Figure 5:
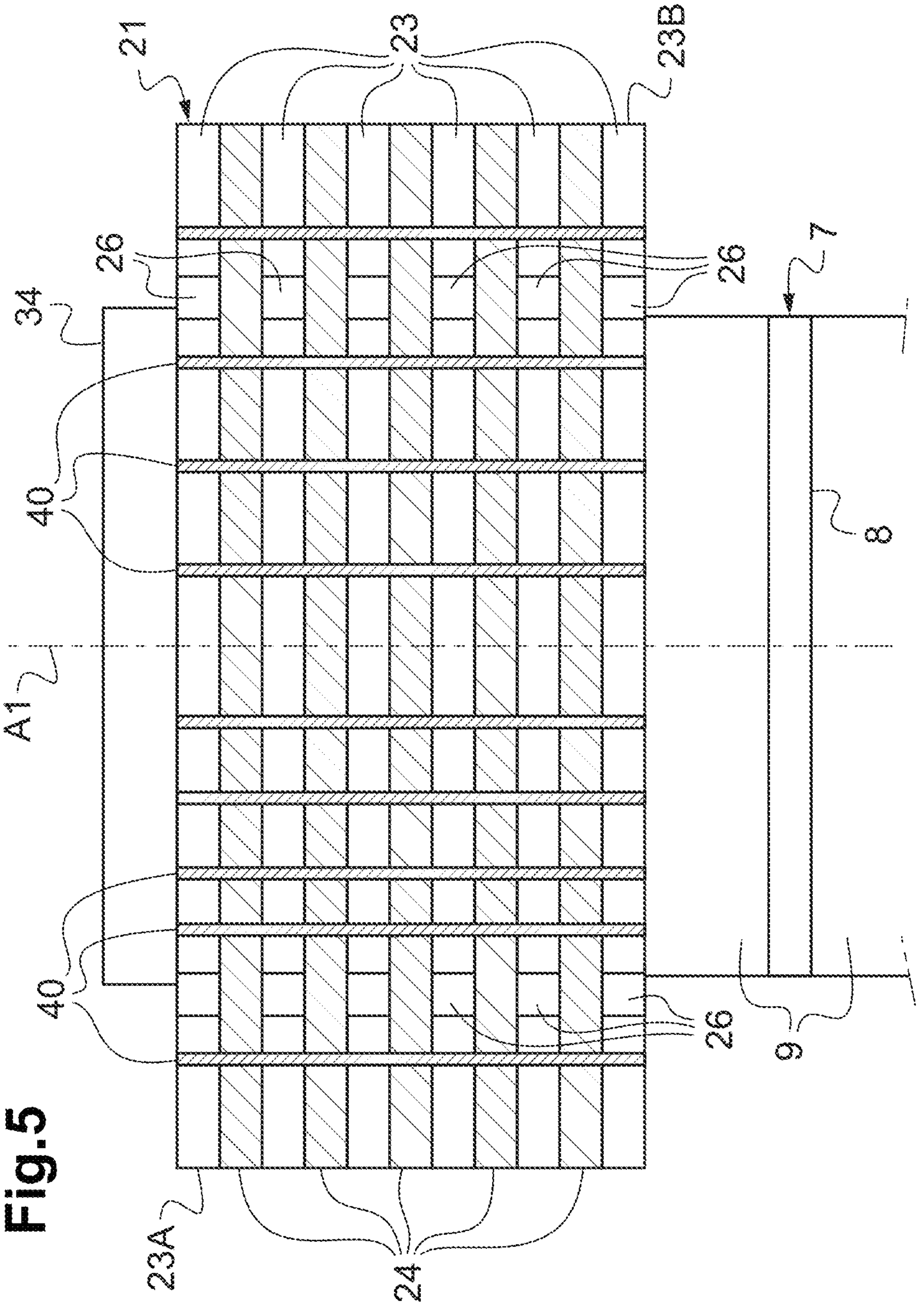
FIG. 5 shows a second example of a printed circuit board comprised in the electronic assembly according to the invention, represented in cross-section from the side.

The electronic assembly 1 comprises at least one electronic module 3, 32, 34; 3*a*, 3*b*. As represented in FIGS. 2, 3 and 5, the electronic assembly comprises only one electronic module 3, 32, 34. According to the alternative represented in FIG. 7, the electronic assembly can comprise two electronic modules 3*a*, 3*b*. As another alternative, the electronic assembly can comprise more than two electronic modules.

The electronic module 3, 32, 34; 3*a*, 3*b* is here a telecommunication circuit, for instance a Network Access Device. The electronic module 3, 32, 34, 32*a*, 32*b* is configured here to establish the wireless communication link WL with the distant network DN. For this purpose, the distant network comprises an Internet network and/or a cellular network.

The automotive vehicle AV is equipped with an internal network IN comprising and linking together various electronics units (for instance, command units, displays, sensors . . . ) of the vehicle AV, among which the electronic module 3, 32, 34; 3*a*, 3*b* hosted by the electronic assembly 1; 10. Therefore, the electronic module 3, 32, 34; 3*a*, 3*b* is able to communicate with the internal network IN of the automotive vehicle and exchange data with the equipment manufacturer backend system EM through the distant network DN.

The exchanged data comprise for example information about the location and the speed of the car, information relating to the maintenance of the vehicle, for instance alerts about a failure of equipment, and more generally to various signals from the sensors of the vehicle AV.

Figure 7:
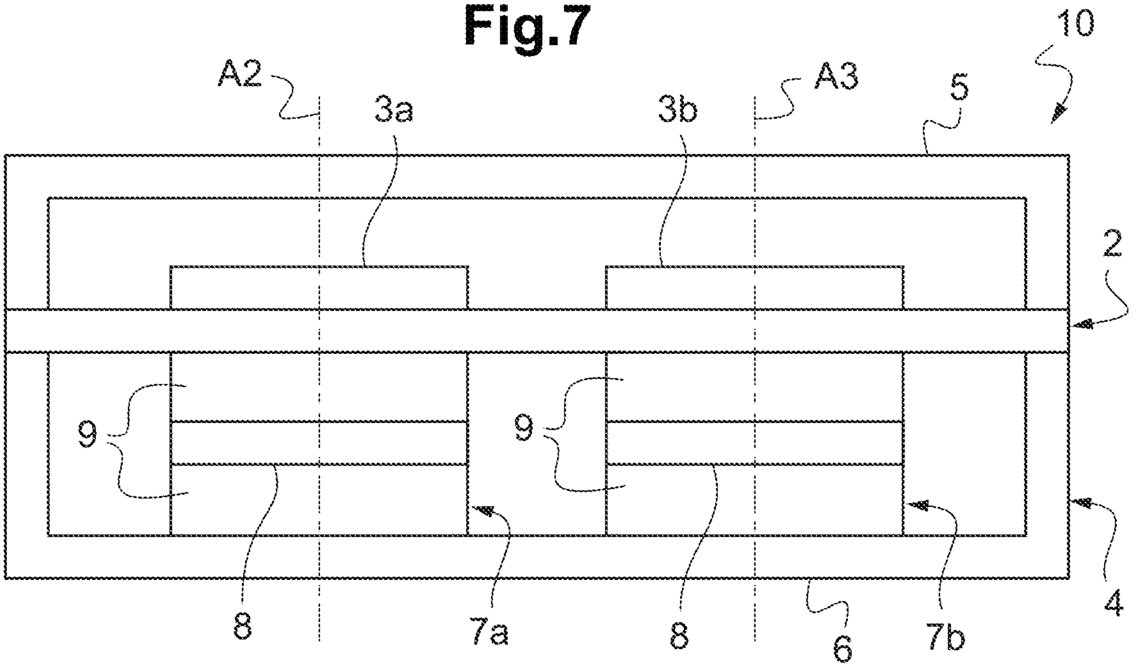
FIG. 7 represents a second example of an electronic assembly according to the invention, represented in cross-section from the side.

FIGS. 2 and 7 represent two examples of the electronic assembly 1; 10 according to the invention. In both examples, the electronic assembly 1; 10 comprises a casing 4, a printed circuit board 2, at least one electronic module 3; 3*a*, 3*b* and at least one cooling module 7; 7*a*, 7*b*.

The casing 4 comprises a non-electrically conductive front wall 5 and a thermally conductive back wall 6, both edged by side walls coming into contact with each other. Side walls 5*a*, 5*b* of the non-electrically conductive front wall 5 are also non-thermally conductive walls. The thermally conductive back wall 6 is for example a metallic wall, for instance an aluminium wall. This metal conductive back wall increases the thermal conduction between the cooling module 7; 7*a*, 7*b* and the electronic module 3; 3*a*, 3*b*.

In the meaning of the invention, a material is qualified as thermally conductive when it allows a sufficient exchange of heat with its environment, i.e. here when it has a heat transfer coefficient greater than 5 $W \cdot M^{-1} \cdot K^{-1}$.

The non-thermally conductive walls (front and side walls) comprise a material that does not interfere with the radio frequency waves, so as to allow the establishment of the wireless communication link WL. For example here, the non-thermally conductive walls of the casing 4 are made of polymer material.

On the contrary, the thermally conductive back wall 6 presents a shielding function in order to enable the damping of the electromagnetic waves.

As represented in FIGS. 2 and 7, each electronic module 3; 3*a*, 3*b* is fixed on a first side 2*a* of the printed circuit board 2. The electronic module 3; 3*a*, 3*b* comprises a plurality of pins (signal and ground pins) so as to electrically couple the concerned electronic module 3; 3*a*, 3*b* and the printed circuit board 2. Most of ground pins of the plurality of pins (not represented) goes through the whole thickness of the printed circuit board in order to allow the heat transfer from the electronic module 3; 3*a*, 3*b* through the printed circuit board 2 to a cooling module 7; 7*a*, 7*b*. The signal pins can end in an intermediate layer of the printed circuit board.

The electronic assembly 1; 10 also comprises at least one cooling module 7; 7*a*, 7*b*. In the main embodiment shown in FIG. 2, it comprises only one cooling module 7. In a variant represented in FIG. 7, each electronic module 3*a*, 3*b* is associated with one corresponding cooling module 7*a*, 7*b*. As a variant (not represented), one single cooling module can be used for several electronic modules.

Each cooling module 7; 7*a*, 7*b* is placed between the printed circuit board 2, on a second side 2*b* of the printed circuit board 2, and the thermally conductive back wall 6 of the casing 4.

In practice, the cooling module 7; 7*a*, 7*b* is thermally coupled to the thermally conductive back wall 6 and to the electronic module 3; 3*a*, 3*b* via thermal pads, thermal paste or thermal foam (not represented). In the meaning of the invention, the wording "thermally coupled" implies a thermal transfer with or without physical contact.

Thermal pads, thermal foam or thermal paste increase the heat transfer (by thermal conduction) between the cooling module 7; 7*a*, 7*b*, the thermally conductive back wall 6 and the electronic module 3; 3*a*, 3*b*. Moreover, the thermal pads, the thermal foam or the thermal paste also act as mechanical stress absorbers. The cooling module 7; 7*a*, 7*b* is thus arranged to reduce the temperature of the electronic module 3; 3*a*, 3*b* by coupling it to the thermally conductive back wall 6. This thermally conductive back wall 6 thus acts as a heatsink.

In practice, the cooling module 7; 7*a*, 7*b* comprises at least one active part 8. Each active part 8 is surrounded by a plate 9 that is placed on each side of the active part 8. In other words, one plate 9 is placed between the printed circuit board 2 and the active part 8 and another plate 9 is placed between the active part 9 and the thermally conductive back wall 6.

The plate 9 is for example made of ceramic.

Each plate 9 comprises, on its inner side (i.e. the side facing the active part 8), an electrically conductive material in order to make the connection between the thermoelectric elements that represents the active part 8.

The thermally conductive back wall 6 comprises fastening means (not represented) in order to keep the cooling module at the right position.

The active part 8 of the cooling module 7; 7*a*, 7*b* is here a Peltier cooler, or thermoelectric cooler. The active part 8 is therefore powered with electricity to transfer heat (by thermal conduction) from a first surface 8*a* of the active part 8 to a second surface 8*b* of the active part. A heat transfer that relies on an external source of energy is qualified as "active". Therefore, a Peltier cooler, which consumes electricity, is an active cooling device. On the contrary, a heat transfer that does not rely on any external energy source is qualified as passive.

The use of a Peltier cooler, or thermoelectric cooler, enhances the cooling capacity of the assembly.

The present invention particularly relates to the printed circuit board of the electronic assembly 1; 10.

As visible in FIGS. 2 and 7, the printed circuit board 2 is located in the casing 4. The electronic assembly 1; 10 comprises fastening means (not represented) that are configured to fix the printed circuit board 2 to the casing 4. These fastening means are also configured to keep the printed circuit board 2 at a distance from the thermally conductive back wall 6, inside the casing 4. In other words, the second side 2*b* of the printed circuit board 2 faces the thermally conductive back wall 6. The fastening means are for example screws.

FIGS. 3 and 5 show two different embodiments of the printed circuit board 20; 21.

As represented in these Figures, the printed circuit board comprises an alternating of at least partially electrically conductive layers 22; 23 and insulated layers 24. The expression "at least partially electrically conductive" means here that the concerned layer is not completely formed by an electrically conductive material but comprises some parts with non-electrically conductive material. Here, an electrically conductive layer 22; 23 comprises more than 50% of an electrically conductive material.

In particular, an external electrically conductive layer 22A; 23A is defined as the electrically conductive layer 22; 23 of the printed circuit board 20; 21 that is the closest to the electronic module 32; 34. Symmetrically, an internal layer 22B; 23B is defined as the electrically conductive layer 22; 23 of the printed circuit board 20; 21 that is the closest to the cooling module 7.

As represented in FIGS. 3 and 5, two consecutive electrically conductive layers 22; 23 are always separated by one insulated layer 24. Symmetrically, two consecutive insulated layers 24 are always separated by one electrically conductive layer 22; 23.

In order to ensure electrical conductivity of the printed circuit board 20; 21, the latter comprises through-hole vias 40 which extends from the first side to the second side of the printed circuit board 20; 21. As represented by arrows in FIG. 3, the electrical connection between two consecutive electrically conductive layer 22; 23 is thus performed thanks to the through-hole vias 40.

These through-holes 40 are filled with an electrically conductive material in order to guarantee the electrical conductivity through all the layers of the printed circuit board 20; 21. The electrically conductive material is here a metal, for example copper.

Advantageously, thanks to the electrical connection provided by the through-hole vias 40 from the first side 2*a* to the second side 2*b* of the printed circuit board 2, these through-hole vias 40 also contribute to the heat transfer from the electronic module 32; 34 to the cooling module 7 through the printed circuit board 2.

For a better understanding of the following, we define a central axis A1 going through a centre of the cooling module 7; 7*a*, 7*b* and the electronic module 32; 34. This central axis A1 is visible in FIGS. 3 and 5.

Figure 4:
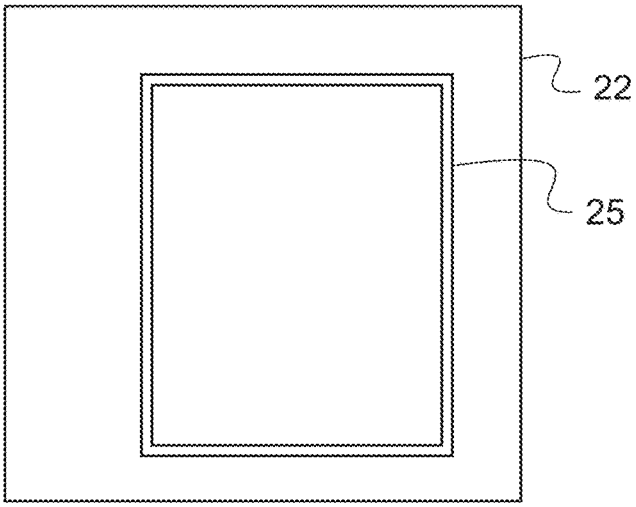
FIG. 4 represents a top view of one electrically conductive layer of the printed circuit board of FIG. 3.
Figure 6:
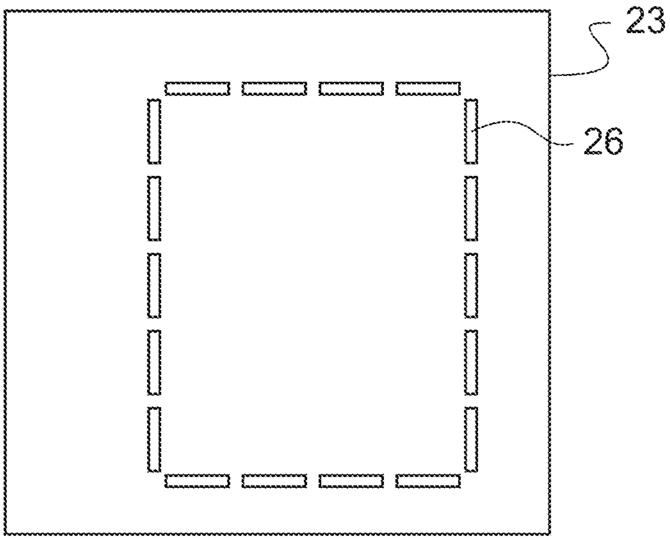
FIG. 6 represents a top view of one electrically conductive layer of the printed circuit board of FIG. 5.

According to the invention, each electrically conductive layers 22; 23 comprises a non-electrically conductive area 25; 26. This non-electrically conductive area 25; 26 extends along at least a part of a closed outline positioned around the central axis A. FIGS. 4 and 6 show two examples of the closed outline. In these examples, the closed outline presents a rectangular shape.

This non-electrically conductive area 25; 26 are free from electrically conductive material. For example, the non-electrically conductive area 25; 26 comprise a material with fibres and a polymer (also commonly named "prepreg").

The electrical conductivity is here guaranteed despite the presence of these non-electrically conductive areas in the electrically conductive layers thanks to the through-hole vias previously described.

Advantageously, the presence of non-electrically conductive areas in the electrically conductive layers allows reducing significantly the thermal conductivity of the printed circuit board and thus improving the global cooling of the electronic module (thanks to the parts without electrically conductive material).

By the expression "at least a part of closed outline", it should be here understood that the non-electrically conductive area 25; 26 extends along at least 80% of the closed outline, and more advantageously along at least 90% of the closed outline.

The first embodiment of the printed circuit board 20 is represented in FIGS. 3 and 4. In this example, the non-electrically conductive area 25 in each electrically conductive layer 22 presents a form of a continuous outline. More particularly, the continuous outline is a continuous rectangle. FIG. 4 is a top view of one electrically conductive layer provided with the continuous rectangle as the non-electrically conductive area 25.

This first embodiment particularly applies to an arrangement in which the ground pins of the electronic module 32 are located in a central area 30 of the electronic module 32 (see FIG. 3).

In this case, the continuous outline of the external layer 22A is a continuous rectangle going along the edges of the central area 30 of the electronic module 32.

On the other end of the electronic assembly 1, the continuous outline of the internal layer 22*b* is a continuous rectangle going along the edges of the cooling module 7.

As visible in FIG. 3, the continuous outline of each electrically conductive layer comprised between the external layer 22A and the internal layer 22B is a continuous rectangle comprised between the continuous rectangle of the external layer 22A and the continuous rectangle of the internal layer 22B.

Here, the respective continuous rectangles associated with two consecutive electrically conductive layers 22 are positioned such as not overlapping with each other through the printed circuit board 20. The respective non-electrically conductive areas 25 of two consecutive electrically conductive layers 22 do not overlap.

In other words, and as represented in the cross-sectional view of FIG. 3 (and except for the internal layer 22B), there are two "columns" of non-electrically conductive areas 25. Two consecutive electrically conductive layers do not comprise non-electrically conductive layers 22 that are in the same column.

Finally, in this first embodiment, and even if the ground pins are located in a central area of the electronic module, non-electrically conductive continuous rectangles of different sizes combined with through-hole vias ensure good electrical ground conductivity across all layers of the printed circuit board. In practice, this arrangement guarantees the electrical ground connection of all layers of the printed circuit board for the parts (of each electrically conductive layer) that are on both sides of the non-electrically conductive area. This arrangement simultaneously significantly reduces the thermal conductivity between, on the one hand, the central part of the printed circuit board that is aligned with the electronic module and the cooling module and, on the other hand, the rest of the printed circuit board that surrounds this central part.

The second embodiment of the printed circuit board 21 is represented in FIGS. 5 and 6. This second embodiment is particularly advantageous in the case where the ground and signal pins of the electronic module 34 are distributed on the whole surface of the electronic module 34 (without being located in specific areas).

For a better understanding of this example, we define a volume extending between the electronic module 34 and the cooling module 7. More specifically, an end of this volume is formed by the contact surface between the electronic module 34 and the printed circuit board 21. Another end of this volume is formed by the contact surface between the printed circuit board 21 and the cooling module 7.

As represented in FIG. 5, in this second embodiment, the closed outline is comprised in or placed in contact with a side surface of the previously defined volume. More particularly, the closed outline of the internal layer 23B is placed outside the previously defined volume whereas the closed outline of all other electrically conductive layers 23 are comprised in this volume.

Furthermore, as visible in FIG. 5, all the non-electrically conductive areas 26 of the electrically conductive layers 23 are here aligned with each other through the printed circuit board 21.

In this example, the non-electrically conductive area 26 in each electrically conductive layer 23 presents a form of a dashed outline. More particularly, this dashed outline is a dashed rectangle (FIG. 6).

In this case, the continuous outline of the external layer 23A is a dashed rectangle going along the edges of the electronic module 34.

On the other end of the electronic assembly 1, the dashed outline of the internal layer 23*b* is a dashed rectangle going along the edges of the cooling module 7.

In this second embodiment, the use of a dashed closed outline ensures areas in the printed circuit board that allow propagating signals from the electronic module to all layers of the printed circuit board. Simultaneously, the non-electrically conductive areas allow reducing the thermal conductivity in the printed circuit board, thus improving the efficiency of the cooling of the electronic module.

Preferably, if the electronic assembly 10 comprises several electronic modules 3*a*, 3*b* (FIG. 7), one closed outline of non-electrically conductive area is associated with each electronic module 3*a*, 3*b*. In other words, we can define a central axis A2, A3 associated with each electronic module 3*a*, 3*b*, the non-electrically conductive area, associated with the corresponding electronic module 3*a*, 3*b*, extend along the corresponding closed outline around the corresponding axis A2, A3.

Preferably, the closed outline associated with one electronic module 3*a*, 3*b* is distinct from the closed outline of the other electronic module 3*b*, 3*a*.

In a variant, the two closed outlines can coincide in part, for example in the area between two adjacent electronic modules.

The invention claimed is:

1. An electronic assembly comprising:

a printed circuit board comprising an alternating arrangement of electrically conductive layers and electrically insulated layers;

at least one electronic module fixed on a first side of the printed circuit board, wherein the electronic module comprises a plurality of pins so as to electrically couple the electronic module and the printed circuit board, and at least one cooling module, placed on a second side of the printed circuit board, wherein each electrically conductive layer of the printed circuit board comprises a non-electrically conductive area extending along at least a part of a closed outline positioned around a central axis going through a center of the cooling module and a center of the electronic module.

2. The electronic assembly according to claim 1, wherein the closed outline is comprised in or placed in contact with a side surface of a volume, wherein an end of the volume is formed by the contact surface between the electronic module and the printed circuit board, wherein another end of the volume is formed by a contact surface of the cooling module and the printed circuit board.

3. The electronic assembly according to claim 1, wherein the non-electrically conductive area in each electrically conductive layer presents a form of a dashed outline.

4. The electronic assembly according to claim 3, wherein an external electrically conductive layer is defined as the electrically conductive layer of the printed circuit board closest to the electronic module, wherein the dashed outline of the external electrically conductive layer is a dashed rectangle going along the edges of the electronic module.

5. The electronic assembly according to claim 3, wherein an internal electrically conductive layer is defined as the electrically conductive layer of the printed circuit board closest to the cooling module, wherein the dashed outline of the internal electrically conductive layer is a dashed rectangle going along the edges of the cooling module.

6. The electronic assembly according to claim 3, wherein all the non-electrically conductive areas of the electrically conductive layers are aligned with each other through the printed circuit board.

7. The electronic assembly according to claim 1, wherein the non-electrically conductive area in each electrically conductive layer presents a form of a continuous outline.

8. The electronic assembly according to claim 7, wherein the ground pins of the electronic module are located in a central area of the electronic module, wherein an external electrically conductive layer is defined as the electrically conductive layer of the printed circuit board closest to the electronic module, wherein the continuous outline of the external electrically conductive layer is a continuous rectangle going along the edges of the central area of the electronic module.

9. The electronic assembly according to claim 8, wherein an internal electrically conductive layer is defined as the electrically conductive layer of the printed circuit board closest to the cooling module, wherein the continuous outline of the internal electrically conductive layer is a continuous rectangle going along the edges of the cooling module.

10. The electronic assembly according to claim 9, wherein each continuous outline is a continuous rectangle, and wherein the continuous rectangles in each electrically conductive layer are comprised between the continuous rectangle of the external electrically conductive layer and the continuous rectangle of the internal electrically conductive layer.

11. The electronic assembly according to claim 10, wherein the respective continuous rectangles associated with two consecutive electrically conductive layers are positioned such as not overlapping with each other through the printed circuit board.

12. The electronic assembly according to claim 7, further comprising a plurality of through-hole vias extending through the printed circuit board, wherein the through-hole vias being are arranged to thermally couple the electronic module to the cooling module.

13. The electronic assembly according to claim 1, wherein the non-electrically conductive area comprises a material with fibers and a polymer.

14. The electronic assembly according to claim 1, further comprising:

a casing comprising a thermally conductive back wall, and fastening means configured to keep the printed circuit board at a distance from the thermally conductive back wall inside the casing, and wherein the cooling module comprising comprises at least one active part.

* * * * *